United States Patent [19]

Shone et al.

[11] Patent Number: 4,679,198
[45] Date of Patent: Jul. 7, 1987

[54] SOLID-STATE TUNABLE LASER

[75] Inventors: Michael F. Shone, Yorktown Heights, N.Y.; Gabriel M. Loiacono, Franklin Lakes, N.J.

[73] Assignee: North American Philips Corporation, New York, N.Y.

[21] Appl. No.: 848,367

[22] Filed: Apr. 4, 1986

[51] Int. Cl.$^4$ .............................................. H01S 3/16
[52] U.S. Cl. ........................................ 372/41; 372/40; 372/68
[58] Field of Search .................. 372/39, 41, 68, 40, 372/43; 252/301.4

[56] References Cited

U.S. PATENT DOCUMENTS

| | | | |
|---|---|---|---|
| 3,624,547 | 11/1971 | Dugger | 372/43 |
| 4,054,852 | 10/1977 | Nicolai et al. | 331/94.5 G |
| 4,167,712 | 9/1979 | Esterowitz et al. | 331/94.5 F |
| 4,284,962 | 8/1981 | Esterowitz et al. | 331/94.5 F |
| 4,347,485 | 8/1982 | Esterowitz et al. | 372/42 |

OTHER PUBLICATIONS

Kozhina, "Glass-14 Formation and Phase Equilibrim in Systems Based on Lithium, Titanium, and Germanium Oxides", Vestn. Leningr Univ. Ser. 4: Fiz, Khim., (3), 66–74; 1986.
Verweij et al., "Structure of Li, N, and K Germanates Glasses, etc.," Journal of Non-Crystalline Solids, 34 (1979) 81-99.
Koelmans et al., "Fluorescence of Binary and Ternary Germanates, etc.," JECS, Aug. 1959, pp. 677-682.
Dugger, "Luminescent Properties of Some Germanate Compounds", JAP, Apr. 1967, pp. 2345-2349.
Powell, "Energy Transfer Between Cr Ions in Nonequivalent Sites in $Li_2Ge_7O_{15}$" Phy. Rev., Sep. 1968, 173-177.
Kroger, "Some Aspects of the Luminescence of Solids", pp. 158-173, Elsevier Publishing, 1948.
Macke, "Luminescence of Ti Activated Stannates and Zirconates and of Nb Activated Tantalates", Doctoral thesis, University Utrecht, 1976, pp. 1-63.
Powell, R. C., "Temperature Dependence of the Widths and Positions of the R Liner in $Li_2Ge_7O_{15}$: $Cr^{3+}$", J.A.P., vol. 39, No. 10, Sep. 1968, pp. 4517-4521.

Primary Examiner—Leon Scott, Jr.
Attorney, Agent, or Firm—Marc D. Schechter

[57] ABSTRACT $Li_4Ge_5O_{12}$ activated by a closed shell ion such as $Ti^{+4}$ or $Sn^{+4}$ as the active medium for a solid state laser that emits in the blue-green region of the visible spectrum.

14 Claims, 8 Drawing Figures

SOLID-STATE TUNABLE LASER

This invention relates to a solid-state laser, and in particular to a solid-state laser that is capable of emitting in the visible range and can be tuned over a reasonably broad bandwidth.

BACKGROUND OF THE INVENTION

Lasers that emit in the visible range have many useful applications. In the medical field, they are used in ophthalmological examinations and surgical procedures. In the communications field, such lasers are useful for transmitters. The blue-green region of the visible spectrum is of special interest because water has a transmission window in that region, and thus lasers that emit in the blue-green region can be used for underwater communications. Such lasers are also useful for welding and cutting operations.

Gas and liquid lasers are known that emit in the blue-green region. Gas and liquid lasers, however, suffer from the disadvantages that they are large, heavy, and very expensive. Another disadvantage is that, frequently, such lasers emit in a narrow spectral region and therefore are not tunable over as wide a range in the sense that that term is used in this specification.

As is well known, lasers require the presence of an optical cavity to provide feedback to allow the emitted light to repeatedly traverse the active medium to establish the conditions for obtaining oscillations. Tuning a laser generally means optimizing the feedback for a particular wavelength while discriminating against all others. But if the lasing medium can only support a narrow frequency band, then the optical cavity must be precisely tuned to that narrow frequency for the system to lase. What is desired is a lasing medium which generates radiation over a relatively broad bandwidth so that tuning of the optical cavity allows any wavelength within that bandwidth to be selected as the output emission. This has not been possible to the best of our knowledge with gas lasers emitting in the visible range.

A solid-state laser has many advantages over a gas or liquid laser, in that it is a more compact construction, lighter in weight, and less fragile. A typical way to pump a solid-state laser is with a known flash lamp which is optically coupled to the active lasing medium. To the best of our knowledge, nobody has ever reported a broad band, tunable solid-state laser that is pumped by a flash lamp and that will emit in the blue-green region of the visible spectrum.

There is much literature that has been published on solid-state lasers. U.S. Pat. No. 4,054,852 describes a solid-state blue-green laser using as the host YLiF$_4$, LaF$_3$ and CaF$_2$, activated with praseodymium$^{+3}$ and holmium$^{+3}$. However, as reported in this patent, such lasers are typically line emitters and therefore are not tunable.

U.S. Pat. No. 3,624,547 to Dugger descirbes a germanate system which may be useful in solid-state lasers. The disclosure includes the following compounds as possible hosts: Li$_2$Ge$_7$O$_{15}$, Li$_2$GeO$_3$, Li$_2$Ge$_4$O$_9$, Li$_4$Ge$_9$O$_{20}$ and Li$_2$Ge$_2$O$_3$. The activators described include chromium, holmium, neodymium, erbium and ytterbium, which are all trivalent. No data is reported in this patent concerning operation of the media described as a laser. In any event, it is not expected that the activators listed would be capable of causing the materials described to emit in the blue-green region of the visible spectrum.

In a concurrently published paper in the *Journal of Applied Physics*, Vol. 38, No. 5, pages 2345–2349 (April 1967), Dugger lists additional experimental data with respect to some of the materials described in U.S. Pat. No. 3,624,547. No data is reported concerning the use of the material as a solid-state laser. The author mainly concentrates on describing the luminescent properties of some of the germanate compounds activated with the different activators mentioned above.

Finding a proper combination of hosts and activators that can be pumped by a flash lamp to emit broad band radiation in the visible range is an extraordinarily complex task. Some of the problems that are encountered include the following.

First, the material must be capable of being grown as a single crystal containing only a single phase in sufficiently large sizes that a suitable section can be machined which has dimensions adequate for it to function as a lasing medium. The resultant single crystal must be reproducible, preferably transparent, and should luminesce in the desired visible spectrum. There may be a number of materials that would satisfy these conditions, but none so far have been reported as capable of being lased by flash lamp pumping, much less to emit over a broad bandwidth.

A second problem is the necessity that the materials should not suffer damage as a result of the internally generated laser radiation or while undergoing pumping from an external source. This generally requires reasonable thermal conductivity for high power operation.

Third, the resultant band structure of the activated host is crucial to its capability to lase in the visible range. The basic lasing mechanism is for the pumping to excite electrons from some lower state to some higher energy excited state. When sufficient electrons have been created in this excited state so that their population exceeds the population in the lower state, then transitions from the excited state back down to the lower state (directly or via some intermediate level) exceed transitions from the lower state to the excited state, enabling amplification of radiation in the desired spectral range.

However, it has been found that many of these materials have bands or levels at a higher energy than the excited state band. Because of the internal band structure, which incidentally is not at all well understood nowadays, there is a preference for the electrons to undergo competing nonradiative transitions to the higher level rather than radiative transitions down to the lower level, with the net result that no lasing action is possible. The present state of the art does not allow predictions as to what would be the desired band structure to ensure the desired lasing action, much less which hosts activated by which activators would create a theoretically desired band structure.

SUMMARY OF THE INVENTION

An object of our invention is a new activated host material that will luminesce in the visible region.

A further object of the invention is a solid-state laser that emits in the visible region.

Another object of the invention is a solid-state laser that can be flash lamp excited or pumped and that emits in the blue-green region of the visible spectrum.

A further object of the invention is a solid-state laser that emits in the visible region over a relatively broad bandwidth and is tunable.

Still another object of the invention is a solid-state laser that emits over a relatively broad band width in the blue-green region of the visible spectrum, and that is capable of reasonably high power outputs.

We have discovered that a lithium germanate compound in the class described by Dugger but not specifically identified in his patent, activated by closed shell ions is capable of lasing in the blue-green region of the visible spectrum over a relatively broad bandwidth.

More specifically, the host material of our invention is $Li_4Ge_5O_{12}$ activated by certain closed shell ions such as $titanium^{+4}$ or $tin^{+4}$. This material can be prepared as a single crystal from a melt composition corresponding to $3Li_2CO_3.8GeO_2$. The crystal $Li_4Ge_5O_{12}$ decomposes when melted and therefore cannot be grown from a stoichiometric melt.

Our experiments indicate that this material is capable of producing laser emissions which is tunable in the range of 400–500 nm. The brightness of the material indicates that the conversion efficiency of pump wavelength/energy to emission is high. This material should be capable of being excited into its lasing state by flash lamp pumping.

We have reproduced two of the germanate hosts specifically identified in the Dugger patent, and activated same with $Ti^{+4}$. They did not luminesce in the blue-green region of the visible spectrum.

We are not sure why the activated material of our invention should exhibit properties which apparently are not present in its close relatives. We believe that the following factor may be significant. The absorption edge of our material as measured by us is at 230 nm, in response to ultraviolet radiation. This suggests that the material has a conduction band which is relatively far removed from the region of its emission which is in the 400–500 nm range. This may account for the absence of competing absorption transitions by electrons in excited states to higher energy allowable levels which upon relaxation under-go downward transitions that are nonradiative. To our knowledge, all other known materials which possess blue stimulated emission centers also are characterized by excited state absorption, which makes such materials unsuitable for efficient blue-green emitting lasers.

Further details concerning the preparation of the material, and the experimental investigations made so far will be found in the detailed description that follows.

DETAILED DESCRIPTION OF PREFERRED EMBODIMENT $Li_4Ge_5O_{12}$ activated by $Ti^{+4}$ was prepared as follows.

$Li_4Ge_5O_{12}$ melts incongruently. It is therefore grown from a nonstoichiometric melt. The melt contains quantities of $Li_2CO_3$ and $GeO_2$ in a mole ration of 3:8. To make an undoped crystal, $Li_2CO_3$ and $GeO_2$ were mixed and reacted at 850° C. in a Pt crucible for 15 hours. To make a doped crystal, the starting materials were $Li_2CO_3$, $GeO_2$, and $TiO_2$ (0.01 to 1.0 mole percent). After calcination, the charge was melted using a 15 kW r.f. generator and the filled crucible then transferred to a resistance furnace. The charge melted at 935° C. into a clear transparent liquid with no evidence of volatilization.

In each case, a seed of random orientation was selected from a previously grown polycrystalline boule and attached with a Pt wire to a $Al_2O_3$ rod. Single crystal growth was achieved at a pulling rate of 1.5 mm/hr and a rotation rate of 30 rpm. Crystals measuring 5×10×35 mm were grown. The grown crystals were cooled to room temperature in approximately 15 hours. Both the pure and $Ti^{+4}$ doped crystals were clear, colorless and free from visible flaws.

Preliminary single crystal and x-ray powder diffraction studies of the single crystal indicate that $Li_4Ge_5O_{12}$ is trinclinic with lattice constants; a=5.120, b=9.143, c=9.586 Å, alpha=72.95°, beta=77.74° and gamma=78.81°. An acentric space group $P_1$ is expected from the preliminary x-ray data and from powder SHG studies which showed a small SHG signal (20 mV) at 28° C. The Ti concentrations in the crystals were analyzed by emission spectroscopy and found to be considerably less than the amounts added to the melt. The density was determined with a pycnometer and found to be 4.63 g/cm$^3$. The X-ray density was 4.66 g/cm$^3$.

Figure 1:
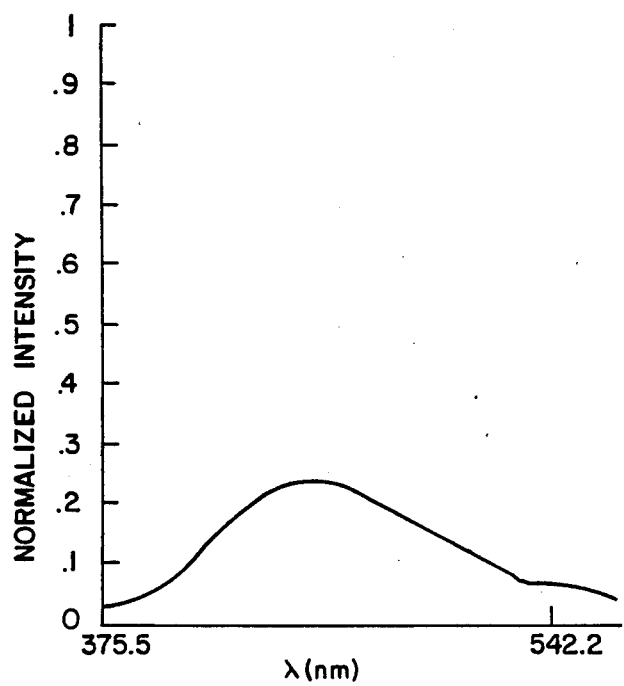
FIGS. 1 and 2 are the emission spectra of the material of our invention excited, respectively, by broad band ultraviolet and a monochromatic source at 266 nm.
Figure 2:
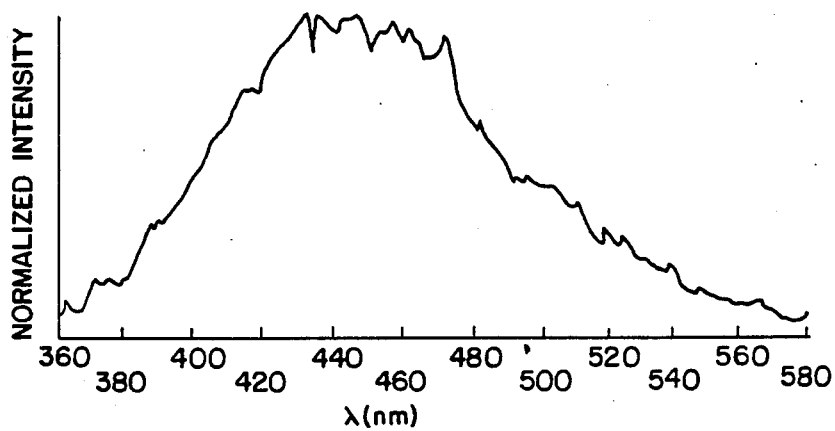

The emission spectra of the single crystal $Li_4Ge_5O_{12}$:$Ti^{+4}$ (0.5 mol. %) were measured and the results are presented in the graphs of FIGS. 1 and 2. The ordinate is normalized intensity and the abscissa is wavelength (λ) in nm. A broad band UV-visible hand-held lamp was used for the excitation which produced the results shown in FIG. 1, while a quadrupled YAG:Nd laser provided a monochromatic source at 266 nm for producing the results shown in FIG. 2. It can be seen that while both emission spectra are broad band, the data of FIG. 1 shows a peak at 455 nm and that of FIG. 2 at 445 nm. It is not known at this time whether this discrepancy is due to noise and calibration effects or due to the method of excitation.

There appears to be only one main fluorescence peak in the material at room temperature. The broad band nature of the emission is believed caused by the large number of vibrations of the titanate octahedral.

Figure 3:
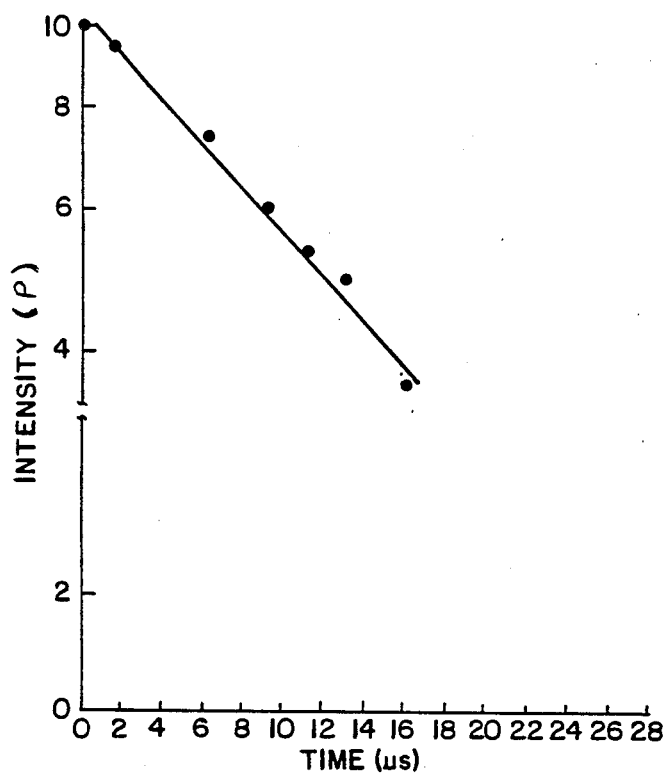
FIG. 3 plots lifetime data for the material of our invention as emission intensity as a function of time, to calculate lifetime.

Lifetime of the emission from the material was measured at room temperature using the 266 nm line from the YAG laser and an oscilloscope. Data from these lifetime measurements are presented in FIG. 3, in which the ordinate, P, is photonic intensity of output, and the abscissa is time in μs. The measured value came to 16.2 usec. This lifetime in the microsecond range is especially favorable for flash lamp pumping.

The lifetime dependence and spectral narrowing versus pump power was also measured using the YAG laser as an exciter pump. The results are depicted in FIGS. 4 and 5.

Figure 4:
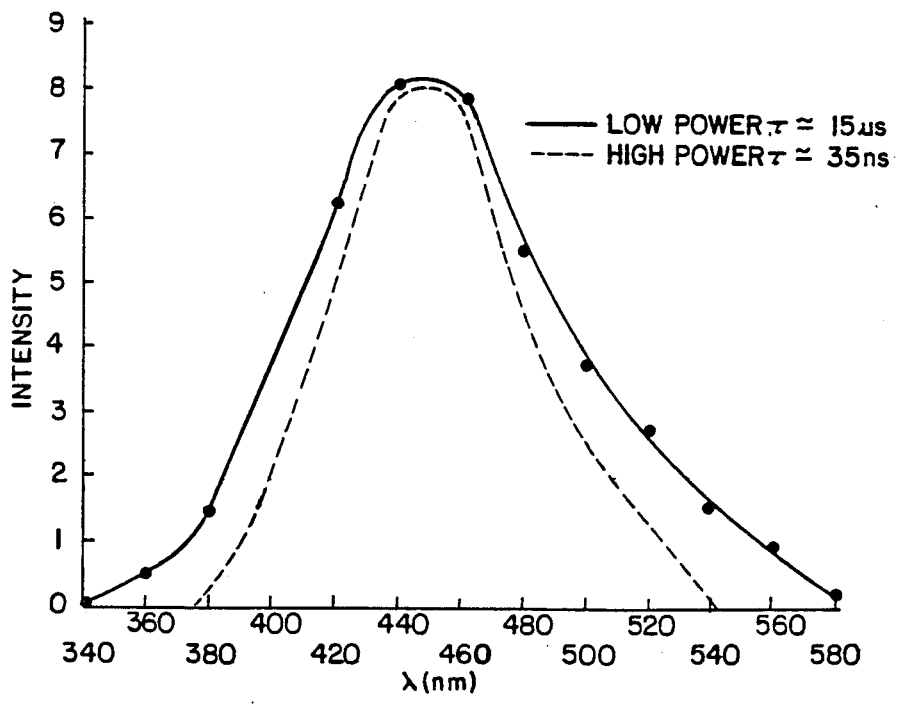
FIG. 4 plots emission spectra of the material of our invention for two values of pumping power.

In FIG. 4, output intensity is plotted as a function of wavelength, λ, in nm. FIG. 4 shows spectral narrowing as the pump power increases.

Figure 5:
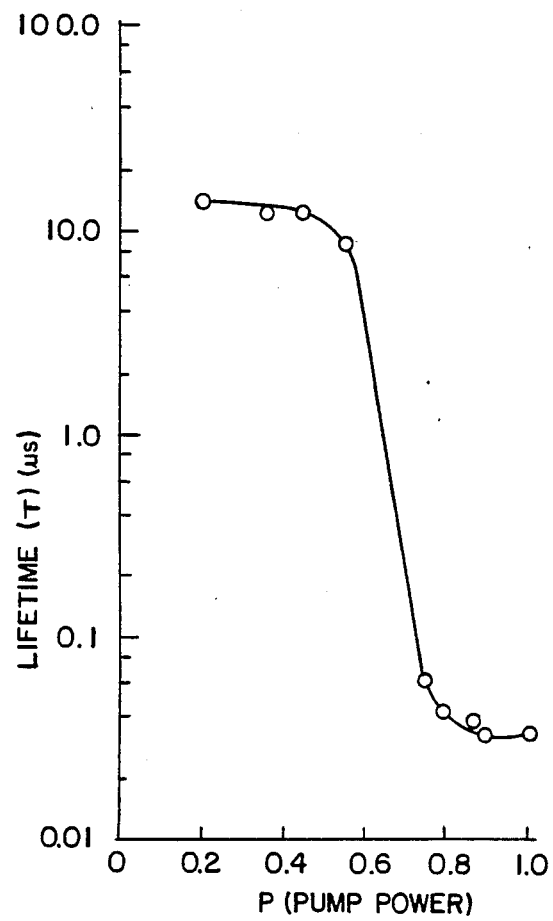
FIG. 5 plots lifetime of the material of the invention as a function of pumping power.

FIG. 5 plots lifetime, T in μs, as a function of pump power P, using 30 ps pulses. FIG. 5 indicates that a constant value of lifetime was observed to an arbitrary power level. Above this power level the lifetime decreased by three orders of magnitude. It is reasonable to assume that this indicated the onset of stimulated emission meaning laser action occurred. Excited state absorption would have had a more gradual effect on lifetime shortening.

Figure 6:
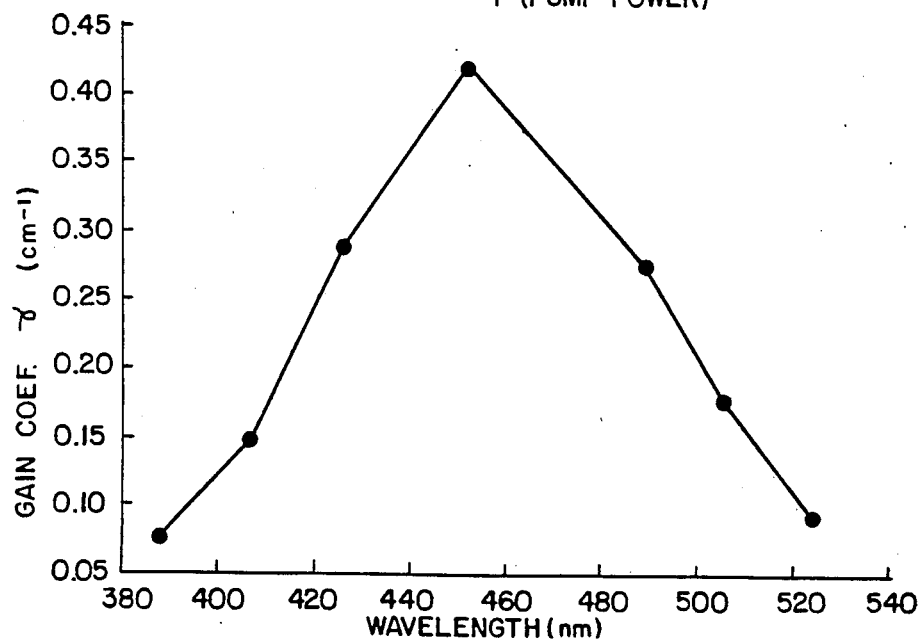
FIG. 6 shows the gain coefficient as a function of wavelength for the material of our invention.

In addition, tests were conducted our host material doped with 0.3 mole % $Ti^{+4}$ for gain coefficient ($\gamma$, $cm^{-1}$) and total gain. These two parameters are related by the equation:

$$e^{\gamma d} = G + 1$$

where d = thickness of the crystal. Testing was again performed using the quadrupled YAG laser. The results of this testing are presented in FIG. 6, in which the gain coefficient, $\gamma$, is plotted as a function of wavelength. A maximum gain coefficient is seen near 460 nm emission and has a value of 5.4 $cm^{-1}$. Other data indicates a 50% gain in power G is observed for a crystal slightly less than 1 mm in thickness.

Figure 7:
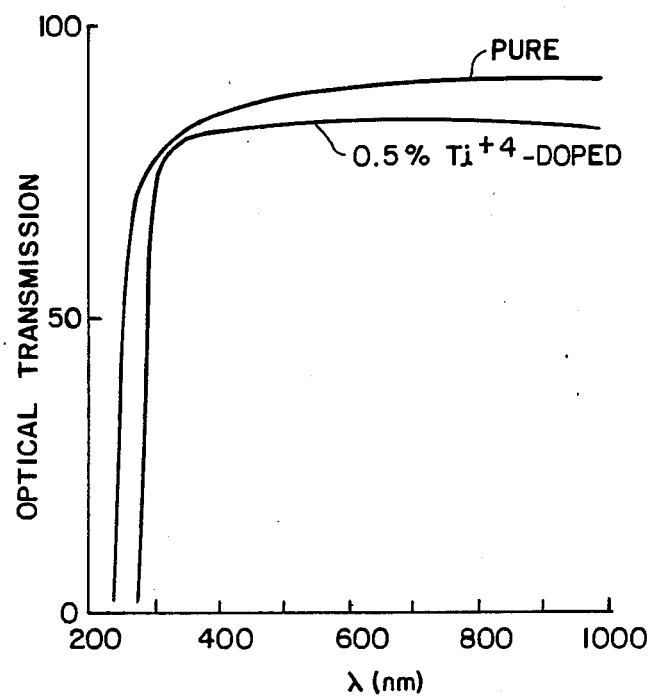
FIG. 7 is the optical spectra of pure and doped $Li_4Ge_5O_{12}$.

Preliminary optical absorption spectra were obtained from nominally pure $Li_4Ge_5O_{12}$ and when doped with 0.5 mol.% $Ti^{+4}$, and are depicted in FIG. 7, wherein the ordinate represents optical transmission as a function of wavelength, λ. The absorption edge for the doped crystal is shifted about 30 nm. There is some evidence of structure in the spectra when the spectra are taken at higher resolution over the range 200 to 400 nm. This is not shown in FIG. 7. The main absorption band for the doped crystal appears to lie between 250-290 nm.

The data shown in FIGS. 1-7 demonstrate that a new material $Li_4Ge_5O_{12}:Ti^{+4}$ has been discovered which shows excellent promise as a tunable blue-green, solid-state laser source. The material exhibits the proper emission characteristics and emission lifetimes, and a pump band exists indicating that the material can be activated or pumped using conventional techniques, for example, state of the art flash lamp equipment as used with $Al_2O_3$:Ti lasers, or pumping using an excimer laser. Our investigations also indicate that up to the moderately high pump levels of the YAG:Nd laser, there is no evidence of damage to the germanate. Both preliminary calculations and experimental data show strong evidence of stimulated emission. In addition, this material can be grown as large single crystals and can be fabricated with relative ease.

The broad band emission over the range of 400-500 nm indicates that solid-state lasers constructed of our new material will be tunable over that range by technology well-known in the art which allows adjustment of the wavelength selectivity of the conventional optical cavities which are used with solid-state lasers. Reference is made to the following publication which describes a tunable optical system that should be usable with the material of our invention: Walling et al., *IEEE Journal of Quantum Electronics*, QE-16, 1302-1315 (1980).

While extensive experiments to data have been made with $titanium^{+4}$, early experimental work indicates that satisfactory results can also be obtained by substituting $tin^{+4}$ for the $titanium^{+4}$ as the activator. $Tin^{+4}$ is also a closed shell ion, by which we mean ions that have no unpaired electrons. Moreover, tin is known to produce blue luminescence in other materials. Also, the tin atom has appropriate dimensions that would allow it to be well fitted into the single crystal structure in a similar fashion to that of the titanium atom, which occupies a germanium substitutional site. It is also expected that other closed shell ions similar to $Ti^{+4}$ and $Sn^{+4}$ in our host should also perform satisfactorily, though the spectrum may not always be in the blue-green region. Other ions include, for example, $W^{+6}$ and $Zn^{+2}$.

Figure 8:
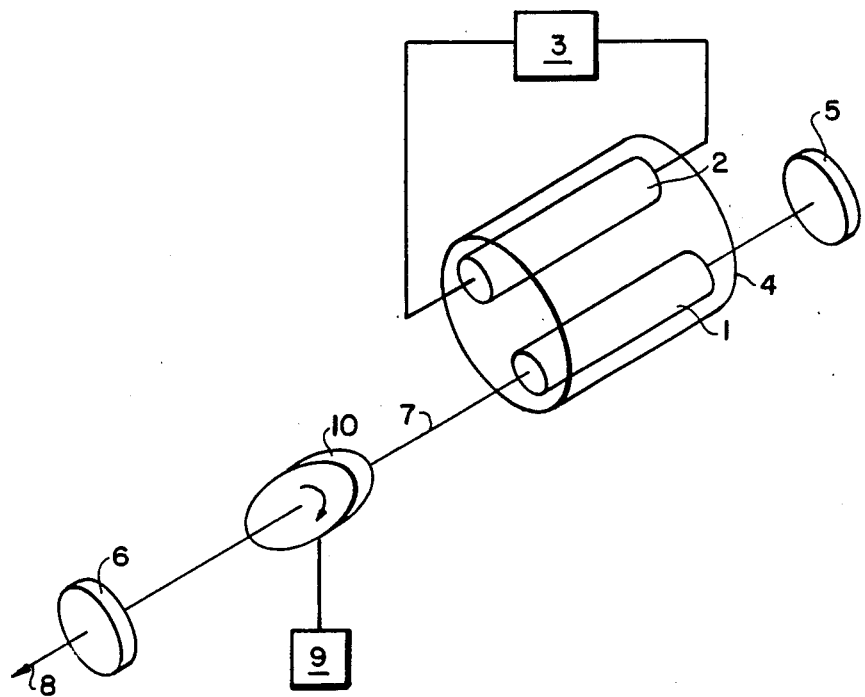
FIG. 8 is a schematic view of a solid state laser in accordance with the invention.

FIG. 8 discloses in schematic form a typical solid-state laser construction employing the material of our invention, which is similar to that described in the Walling et al. publication above-referenced. A closed shell ion-activated $Li_4Ge_5O_{12}$ single crystal rod is indicated by reference numeral 1, and is coupled to a conventional xenon flashlamp 2, activated by a power source 3. A flashlamp cavity 4 to focus the pumping radiation onto the lasing medium 1 surrounds the flashlamp 2 and lasing rod 1. Appropriate mirrors 5 and 6 are located at opposite ends of the crystal 1 in line with its optical axis 7. The mirror 5 at the right is 100% reflecting, whereas the mirror 6 at the left is only about 90-99% reflecting to allow transmission of the output laser beam as indicated by the arrow 8.

Suitable means can be provided shown schematically by block 9 which would allow adjustment of a suitable tuning element 10, such as a grating or a birefringent filter as in the referenced publication, which would allow selection of a particular wavelength over a band of at least 40 nm. As mentioned above, liquid lasing materials which emit in the visible spectrum do not have the potential continuous tuning range of stability for long-term high-power operation, and gas lasers (or excimers) are usually not tunable.

It will be apparent to those skilled in the art from the foregoing description that our invention will be able to produce a continuum of high-power blue or green laser radiation using conventional flash lamp pumping and which will be tunable over a reasonable range. Lasing devices with these capabilities would have wide use in the various fields described above.

It will further be evident to those skilled in the art that various additional modifications of the invention are possible within the principles described above, and all such variations which basically rely on the teachings herein through which the invention has advanced the art are properly considered within the spirit and scope of this invention.

What is claimed is:

1. A $Li_4Ge_5O_{12}$ crystal material activated with an amount of a closed shell activator effective to produce emissions in the visible spectrum when excited by ultraviolet or higher energy radiation.

2. The material of claim 1 wherein the activator is $Ti^{+4}$ or $Sn^{+4}$.

3. The material of claim 2 wherein the activator content is about 0.01-1.0 mol.%.

4. The material of claim 1 wherein said crystal is a single crystal.

5. A single crystal of single phase material comprising Li, Ge, and O atoms in the atomic range of 4:5:12 and having a triclinic crystal structure.

6. The crystal of claim 5 wherein said crystal is activated to produce visible emissions when excited by higher energy.

7. The crystal of claim 5 wherein said crystal contains $Ti^{+4}$ in an amount effective to produce blue-green emissions.

8. A solid-state laser comprising a single crystal rod of $Li_4Ge_5O_{12}$ activated with an amount of a closed shell ion effective when excited to produce emissions in the visible region, and means for optically pumping the single crystal rod into the lasing state.

9. The laser of claim 8 wherein the closed shell ion is $Ti^{+4}$ or $Sn^{+4}$ and the emission is in the blue-green region.

10. The laser of claim 9 wherein the emission is in the range of 400–500 nm.

11. The laser of claim 8 wherein the pumping means comprises a flash lamp pump.

12. The laser of claim 8 wherein the pumping means is an excimer laser.

13. The laser of claim 11 further comprising an optical cavity for the single crystal rod, and means for tuning the optical cavity over a range of at least 40 nm.

14. The laser of claim 8 further comprising optical means for causing the emissions to repeatedly traverse the single crystal rod, and means for turning the optical means to select a particular wavelength to output from the optical means.

* * * * *